(12) United States Patent
Barcella et al.

(10) Patent No.: US 12,638,483 B2
(45) Date of Patent: May 26, 2026

(54) METHOD OF MONITORING A CLOCK SIGNAL, CORRESPONDING DEVICE AND SYSTEM

(71) Applicant: STMicroelectronics International N.V., Geneva (CH)

(72) Inventors: Antonio Barcella, Gorlago (IT); Mario Rotigni, Bergamo (IT); Nicolas Bernard Grossier, Oreno Di Vimercate (IT)

(73) Assignee: STMicroelectronics International N.V., Geneva (CH)

( * ) Notice: Subject to any disclaimer, the term of this patent is extended or adjusted under 35 U.S.C. 154(b) by 262 days.

(21) Appl. No.: 18/436,644

(22) Filed: Feb. 8, 2024

(65) Prior Publication Data

US 2024/0288478 A1     Aug. 29, 2024

(30) Foreign Application Priority Data

Feb. 27, 2023     (IT) ........................ 102023000003510

(51) Int. Cl.
| | |
|---|---|
| *G01R 23/00* | (2006.01) |
| *G01S 19/13* | (2010.01) |
| *H03K 5/26* | (2006.01) |
| *H03K 19/20* | (2006.01) |

(52) U.S. Cl.
CPC ............ *G01R 23/005* (2013.01); *G01S 19/13* (2013.01); *H03K 5/26* (2013.01); *H03K 19/20* (2013.01)

(58) Field of Classification Search
CPC ........ G01R 23/005; G01S 19/13; H03K 5/26; H03K 19/20

USPC ........................................................... 327/20
See application file for complete search history.

(56) References Cited

U.S. PATENT DOCUMENTS

| | | | | |
|---|---|---|---|---|
| 5,954,772 A * | 9/1999 | Akiyama | ................. | G06F 11/24 |
| | | | | 714/E11.154 |
| 7,242,223 B1 | 7/2007 | Alon | | |
| 8,937,496 B1 * | 1/2015 | Ahmad | .................... | H03K 5/19 |
| | | | | 327/39 |
| 9,450,641 B2 * | 9/2016 | Chung | ...................... | G06F 1/08 |
| 10,795,783 B2 * | 10/2020 | Wojewoda | .......... | G06F 11/1604 |

(Continued)

OTHER PUBLICATIONS

NXP Semiconductors, "The Clock Monitor Unit (CMU) Initializing the CMU on MPC56xx & MPC57xx Devices", Document No. AN12080, Rev. 0, Nov. 2017, 8 pages.

*Primary Examiner* — William Hernandez
(74) *Attorney, Agent, or Firm* — Slater Matsil, LLP

(57)     ABSTRACT

A method comprises receiving an input clock signal having a clock frequency band between a lower frequency limit value and an upper frequency limit value, dividing the clock frequency band in a set of frequency ranges having a set of frequency limit values that include the lower frequency limit value and the upper frequency limit value, comparing the frequency of the clock signal with the set of frequency limit values to produce comparison indicators having a first logic value when the measured frequency fails to exceed at least one frequency limit value and having a second logic value when the measured frequency exceeds the at least one frequency limit value, and, as a result of at least one of the logic values of comparison indicators having the second logic value, producing a global flag signal indicating that the measured frequency falls outside of a frequency range.

20 Claims, 10 Drawing Sheets

(56) References Cited

U.S. PATENT DOCUMENTS

| | | | |
|---|---|---|---|
| 2007/0230647 A1 * | 10/2007 | Pourbigharaz | ........ H04L 7/0083 |
| | | | 375/371 |
| 2008/0084918 A1 | 4/2008 | Tennant | |
| 2008/0172195 A1 * | 7/2008 | Nakadaira | ........ G01R 31/31726 |
| | | | 375/374 |
| 2010/0097102 A1 | 4/2010 | Masaki | |
| 2013/0249609 A1 | 9/2013 | Taki | |
| 2021/0320686 A1 | 10/2021 | Borkenhagen et al. | |

* cited by examiner

METHOD OF MONITORING A CLOCK SIGNAL, CORRESPONDING DEVICE AND SYSTEM

CROSS-REFERENCE TO RELATED APPLICATIONS

This application is a translation of and claims the priority benefit of Italian patent application number 102023000003510, filed on Feb. 27, 2023, entitled "Method of monitoring a clock signal, corresponding device and system," which is hereby incorporated herein by reference to the maximum extent allowable by law.

TECHNICAL FIELD

The description relates to electromagnetic compatibility (EMC) in integrated circuits (ICs).

One or more embodiments may refer to methods and systems comprising ICs sensitive to EMC levels, such as navigation systems for providing position information on-board a vehicle, for instance.

BACKGROUND

Spread spectrum techniques comprise methods of spreading the signal bandwidth of a generated signal in the frequency domain, resulting in a spread signal with a wider bandwidth than the original signal bandwidth.

A clock signal having controlled variation of the frequency is currently referred to as a spread spectrum clock (SSC). SSC generation may provide improvements in terms of EMC performance, in particular in synchronous digital systems.

Electromagnetic compatibility (EMC) is the ability of electrical equipment and systems to function acceptably in their electromagnetic environment, by limiting the unintentional generation, propagation and reception of electromagnetic energy which may cause unwanted effects such as electromagnetic interference (EMI) or even physical damage in operational equipment.

A disturbance generated by an external source that affects an electrical circuit by electromagnetic induction, electrostatic coupling, or conduction are exemplary EMI phenomena.

Operation of any electronic device is linked to the reliability of clock signals. Therefore, there is an interest in the possibility to notify any fault or variation of the clock signal to user circuits.

Conventional clock monitor units (CMUs) can be used to monitor the reliability of clock signals, for instance in safety-critical scenarios. CMUs can be configured to trigger an appropriate reaction of the system in case of clock failure.

A drawback of existing CMUs lies in their lack of ability to detect a spread in the clock bandwidth, leaving them vulnerable to faults of the SSC generation.

In an exemplary scenario with SSC generation, the electromagnetic radiation emitted by the device may exceed the maximum limit, potentially causing failures of connected devices in the system.

For example, an exemplary application scenario is that of Global Navigation Satellite System (GNSS), which represents a currently leading technology for positioning applications in the automotive field. GNSS is conventionally used in navigation systems including navigation and telematics.

For instance, EMC is of particular relevance for GNSS systems, as the level of electromagnetic emission tolerated in proximity of the GNSS system is rather low with respect to other systems.

Emerging applications such as autonomous driving, car-to-car (and car-to-infrastructure) communications will expectedly foster further technological challenges in the near future.

It is noted that issues as discussed in the foregoing may arise in a variety of devices, such as:

automotive devices, such as control units for vehicle automated manual transmission system, gasoline multi-point fuel injection system, radar system in advanced driver assistance systems (ADAS), vehicle control in electric vehicles, infotainment processor in automotive sound systems, active suspension systems, driver monitoring systems;

industrial devices, such as CNC machine or programmable safety controller control units; and medical devices, such as continuous positive airway pressure (CPAP) systems.

SUMMARY

An object of one or more embodiments is to contribute in overcoming the aforementioned drawbacks.

According to one or more embodiments, that object can be achieved via a method having the features set forth in the claims that follow.

One or more embodiments may relate to a corresponding device and a corresponding system.

For instance, a GNNS system equipped on board a vehicle may be exemplary of a system as per the present disclosure.

The claims are an integral part of the technical teaching provided herein with reference to the embodiments.

One or more embodiments facilitate countering any reduction of sensitivity that could compromise the quality of the positioning data obtained via GNSS.

One or more embodiments facilitate an active usage of GNSS data in the context of driving support and/or self-driving application.

One or more embodiments facilitate amplifying an immunity to electromagnetic interference of GNSS receivers.

It is again noted that, while discussed herein with attention paid primarily to navigation systems, the embodiments are applicable to a variety of systems such as, e.g., automotive systems (such as control units for vehicle automated manual transmission system, gasoline multi-point fuel injection system, radar system in advanced driver assistance systems—ADAS, vehicle control in electric vehicles, infotainment processor in automotive sound systems, active suspension systems, driver monitoring systems), industrial systems (such as computer numeric control (CNC) machines or programmable safety controller control units) and/or medical systems (such as continuous positive airway pressure (CPAP) systems).

BRIEF DESCRIPTION OF THE DRAWINGS

One or more embodiments will now be described, by way of non-limiting example only, with reference to the annexed Figures, wherein:

FIG. 4 is an exemplary diagram of a method as per the present disclosure;

FIGS. 7 to 9 are exemplary diagrams of one or more alternative devices as per the present disclosure.

Corresponding numerals and symbols in the different figures generally refer to corresponding parts unless otherwise indicated.

Figures 1, 2:
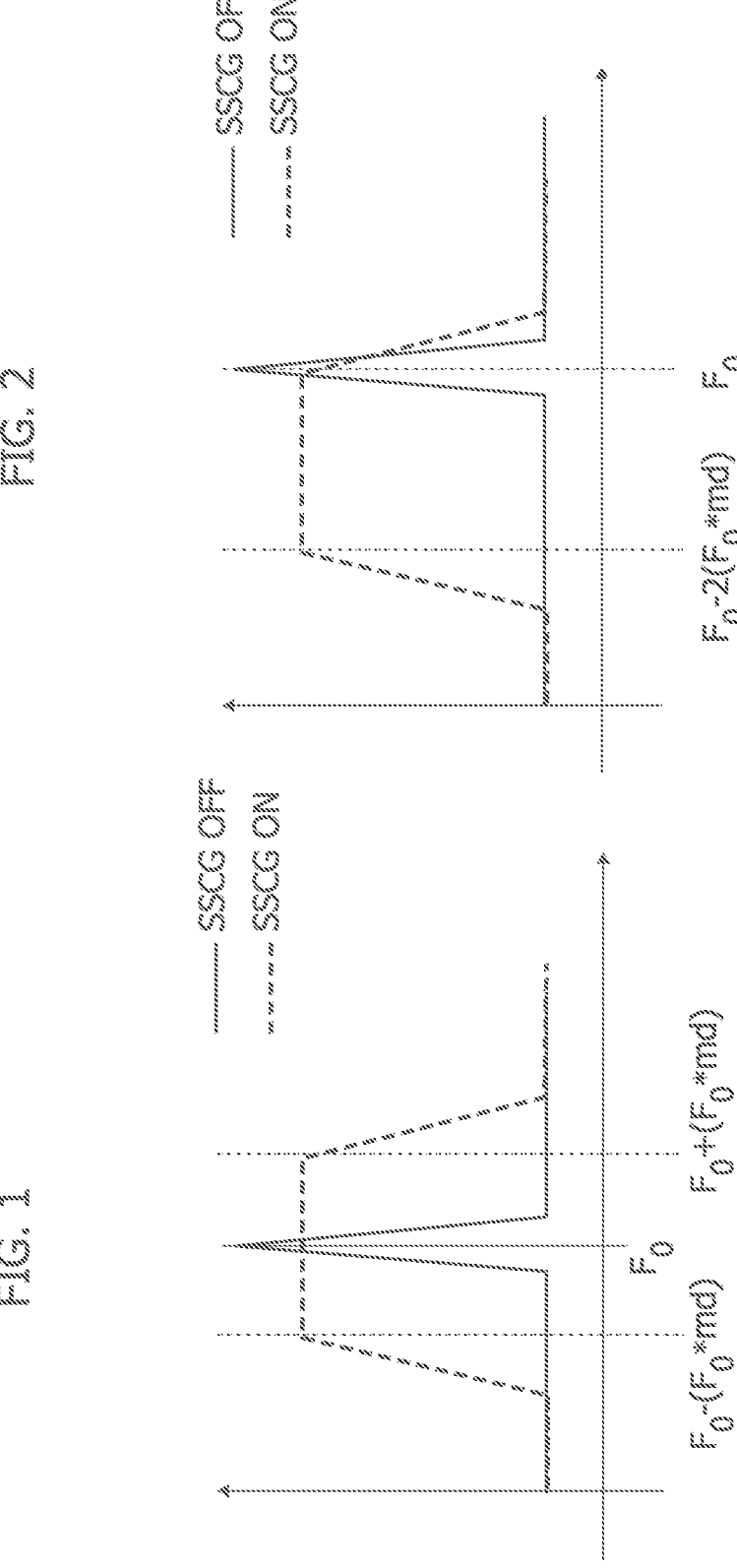
FIGS. 1 and 2 are exemplary diagrams of signals in the frequency domain.

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

For the sake of simplicity, in the following detailed description a same reference symbol may be used to designate both a node/line in a circuit and a signal which may occur at that node or line.

Spread-spectrum clock generation (SSCG) is used in some synchronous digital systems, for instance those containing microprocessors, in order to reduce the spectral density of the electromagnetic interference (EMI) that these systems generate. For example, a phone call and a video display happening in nearby systems should not affect each other.

A synchronous digital system comprises a clock signal which, because of its periodic nature, has a naturally narrow frequency spectrum. Ideally, a clock signal has energy concentrated at a single frequency (the desired clock frequency) and harmonics thereof. Practical synchronous digital systems radiate electromagnetic energy on a number of narrow bands spread on the clock frequency and related harmonics, resulting in a frequency spectrum that, at certain frequencies, can exceed the regulatory limits for electromagnetic interference (e.g., those of the FCC in the United States, JEITA in Japan and the IEC in Europe).

Spread-spectrum clocking counters this, reducing a peak radiated energy and, therefore, its electromagnetic emissions and so comply with electromagnetic compatibility (EMC) regulations.

SSCG spreads the electromagnetic energy over a wider frequency band (for instance, few percent around or below the carrier frequency) to reduce the electrical and magnetic field strengths measured within a narrow window of frequencies. The peak electromagnetic energy at any one frequency is reduced by modulating the SSCG output.

SSCG can be applied in the so-called "center-spread mode" or in the so-called "down-spread mode", exemplified in FIGS. 1 and 2, respectively.

As exemplified in FIGS. 1 and 2:

when SSCG is turned off, a narrow-band clock signal has carrier frequency $F_0$ and maximum amplitude $A_{OFF}$;

when center-spread mode SSCG is turned ON (represented in FIG. 1), the bandwidth of the clock signal is spread symmetrically across the carrier frequency $F_0$, e.g., in a range of frequencies from $F_0-(F_0*md)$ to $F_0+F_0*md$ where md is a positive real number, leading to a reduced amplitude $A_{ON}$ of the spread signal as a result; and when down-spread mode SSCG is turned ON (represented in FIG. 2), the bandwidth of the clock signal is spread backwards from the carrier frequency $F_0$, e.g., in a range of frequencies from $F_0-2(F_0*md)$ to $F_0$ where md is a positive real number, leading to a reduced amplitude $A_{ON}$ of the spread signal as a result.

The SSCG technique can be used in a variety of electronic systems, such as portable electronics devices designed to be lightweight and relatively cheap.

Figure 3:
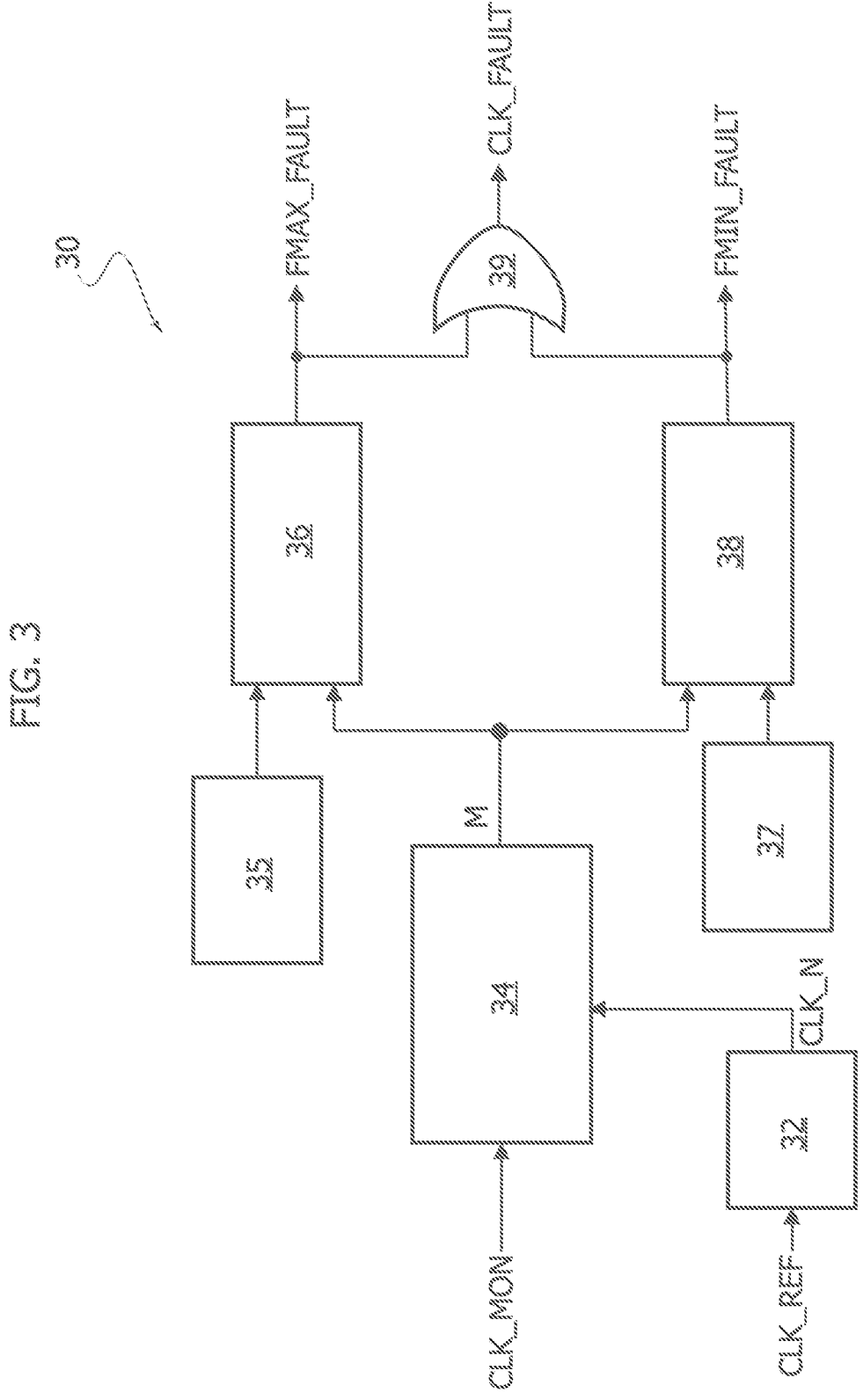
FIG. 3 is an exemplary diagram of a clock monitoring unit, CMU.

As exemplified in FIG. 3, a conventional control monitor unit device 30 for detecting clock failure comprises:

an input clock node CLK_MON configured to receive a clock signal CLK_MON whose frequency is to be checked, a reference clock node CLK_REF configured to receive a reference clock signal CLK_REF, deemed reliable, a frequency divider circuit block 32 coupled to the reference clock node CLK_REF to receive the reference clock signal CLK_REF therefrom, providing a frequency divided reference clock CLK_N (e.g., having a divided frequency that is an integer fraction N of the reference frequency of the reference clock signal CLK_REF);

a frequency counter circuit block 34 coupled to the input clock node CLK_MON to receive the input clock signal CLK_MON therefrom and coupled to the frequency divider 32 to receive the divided reference clock signal CLK_N therefrom, the frequency counter 34 configured to measure a frequency of the input clock signal CLK_MON, providing the measured frequency M every time the reference clock signal CLK_REF performs an integer of N clock periods;

a first comparator 36 coupled to the frequency counter circuit 34 to receive the measured frequency M and coupled to a first register 35 configured to store a maximum frequency value $F_{MAX}$ for the input clock signal CLK_MON (e.g., stored as a result of being loaded during an initial setup phase of a microprocessor programmed for a specific application or as a hard-coded value), the first comparator 36 configured to compare the measured frequency M with the maximum frequency value $F_{MAX}$ stored in the first register 35, and to produce a first flag signal FMAX_FAULT having a first logic value (e.g., "true" or "1") in case the measured frequency M exceeds the maximum frequency value $F_{MAX}$ and a second logic value (e.g., "false" or "0") in case the measured frequency M fails to exceed the maximum frequency value $F_{MAX}$;

a second comparator 28 coupled to the frequency counter circuit 34 to receive the measured frequency M and coupled to a second register 37 configured to store a minimum frequency value $F_{MIN}$ for the input clock signal CLK_MON (e.g., stored as a result of being loaded during an initial setup phase of a microprocessor programmed for a specific application or as an hard-coded value), the second comparator 38 configured to compare the measured frequency M with the minimum frequency value $F_{MIN}$ stored in the second register 37, and to produce a second flag signal FMIN_FAULT having a first logic value (e.g., "true" or "1") in case the measured frequency M fails to reach the minimum frequency value $F_{MIN}$ and a second logic value (e.g., "false" or "0") in case the measured frequency M reaches the minimum frequency value $F_{MIN}$; and a logic OR circuit 39, coupled to the first 36 and second 38 comparator to receive the respective first FMAX_FAULT and second FMIN_FAULT flag signals, the logic OR circuit 39 configured to assert a clock fault signal CLK_FAULT as a result of any one of the first FMAX_FAULT and the second FMIN_FAULT flag signals having the first logic value, the clock fault signal CLK_FAULT indicative of the monitored input clock signal CLK_MON being slower or faster than expected.

As appreciable to those of skill in the art, the conventional CMU 30 exemplified in FIG. 3 lacks the capability of detecting whether the clock bandwidth is spread, leaving the system vulnerable to spread spectrum clock errors.

Figure 4:
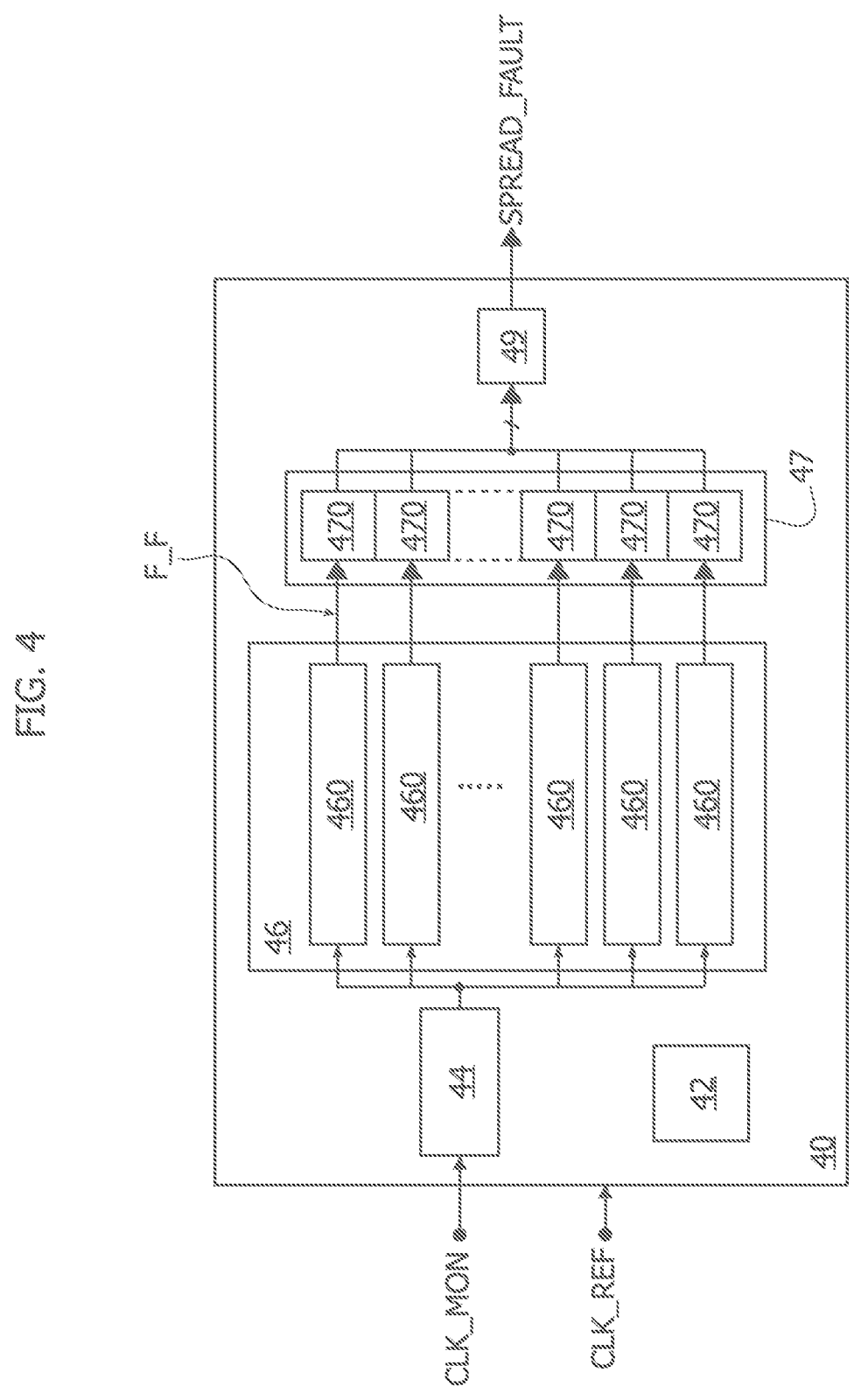

As exemplified in FIG. 4, a CMU 40 according to the preset disclosure comprises:

an input clock node CLK_MON configured to receive a clock signal CLK_MON whose frequency is to be checked, a reference clock node CLK_REF configured to receive a reference clock signal CLK_REF, deemed reliable, a control circuit 42 configured to control operation of the CMU 40, as discussed in the following;

a frequency counter circuit block 44 coupled to the input clock node CLK_MON to receive the input clock signal CLK_MON therefrom and to the reference clock node CLK_REF to receive the reference clock signal CLK_REF therefrom, the frequency counter circuit 44 configured to measure a frequency M of the input clock signal CLK_MON;

a set 46 of comparison blocks 460 coupled to the frequency counter circuit 44 to receive the measured frequency M therefrom, wherein comparison blocks 460 in the set 46 are configured to compare the measured frequency M with a respective K-th range of a corresponding plurality of frequency ranges, producing a corresponding plurality of flag signals F_F, wherein each k-th flag signal has a first logic value (e.g., "true" or "1") in case the measured frequency M fails to reach a k-th maximum frequency value of the k-th frequency range and exceeds the k-th minimum frequency value of the k-th frequency range and has a second logic value (e.g., "false" or "0") otherwise;

a plurality of flag registers 47 coupled to the set 46 of comparison block 460, each register 470 in the plurality of flag registers 47 configured to store the logic value of the respective k-th flag signal F_F provided by a respective k-th comparison block 460 in the set 46;

a verification circuit 49 coupled to each register in the plurality of flag registers 47, the verification circuit 28 configured to raise a spread-spectrum flag SPREAD_FAULT in response to any of the logic values stored in the registers in the plurality of flag registers 47 being equal to the second logic value (e.g., "false" or "0").

For instance, in an exemplary and non-limiting scenario, the set of frequency limit values are separated therebetween in a uniform manner, e.g., by a quantity calculated as a ratio of the clock frequency band and the integer value K. For instance, in an alternative and non-limiting scenario, the set of frequency limit values are separated therebetween in a non-uniform manner, e.g., with each sub-range boundary being set independently from the others.

For the sake of simplicity, one or more embodiments are discussed in the following with respect to an exemplary case in which the number K of subranges in which the acceptable values of the clock frequency $f_{CLK\_MON}$ is divided is three, such a number being purely exemplary and in no way limiting. One or more embodiments may exhibit notionally any number K of subranges for the clock frequency $f_{CLK\_MON}$ values. For instance, the number K of frequency subranges can be a design parameter and can be variable depending on the application, e.g., can be selected by the control logic circuit 42, via a programmable register.

Figure 5:
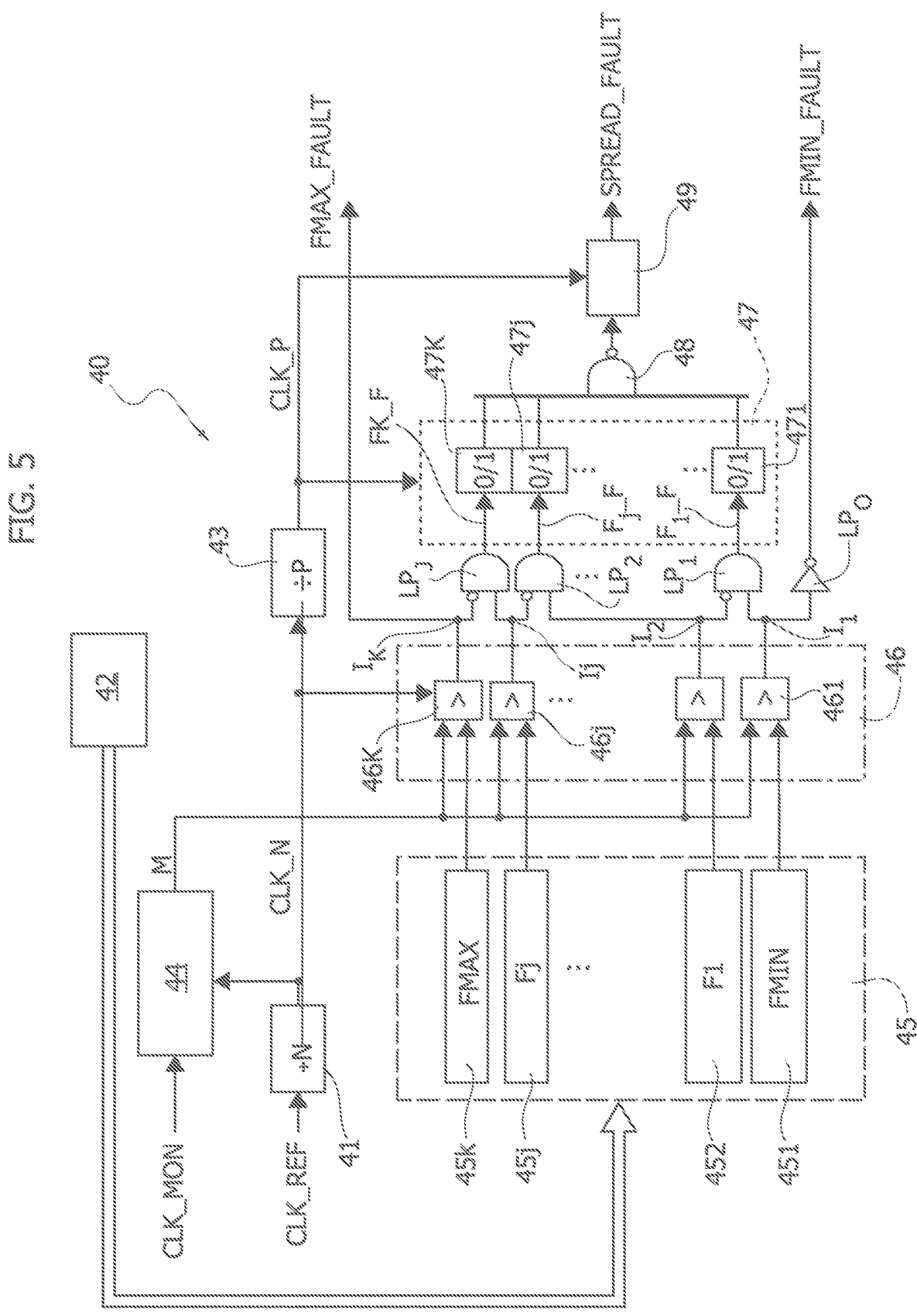
FIG. 5 is an exemplary diagram of a device as per the present disclosure.

In a first exemplary scenario illustrated in FIG. 5, the device 40 comprises:

a first clock divider 41 coupled to the reference clock node CLK_REF to receive the reference clock CLK_REF therefrom, providing a first frequency divided reference clock CLK_N (e.g., having a divided frequency that is an integer fraction N of the reference frequency of the reference clock signal CLK_REF);

a second clock divider 43 coupled to the first clock divider 41 to receive the first frequency divided reference clock CLK_N therefrom, providing a second frequency divided reference clock CLK_P (e.g., having a divided frequency that is an integer fraction N*P of the reference frequency of the reference clock signal CLK_REF, where P may be programmable to have any values above or equal to the number K of frequency subranges, that is P≥K);

the frequency counter 44 is coupled to the first frequency divider 41 to receive the first frequency divided clock signal CLK_N therefrom and is coupled to the input node CLK_MON to receive the input clock signal CLK_MON therefrom, the frequency counter 44 configured to measure the clock frequency of the input clock CLK_MON, for instance performing a measurement M thereof during integer N periods of the reference clock CLK_REF, in a continuous back-to-back manner.

For instance, during a measurement time window of N periods of the reference clock CLK_REF, the frequency counter 44 counts the "ticks" of the input clock CLK_MON; after lapse of the N-th period of the reference clock, the frequency counter 44 stores a value that is based on the average frequency of the input clock CLK_MON detected during the measurement window.

As exemplified in FIG. 5, the device 40 further comprises:

a set of registers 45, e.g., comprising four registers 451, 452, 45j, 45K, each register (e.g., a j-th register 45j) in the set of registers 45 configured to store a limit value (e.g., the lower or upper limit value) for a respective (e.g., j-th) subrange of values in which the measured clock frequency M may belong to; for instance, the control logic unit 42 may be configured to select the number K of values and to write in the set of registers 45 the respective limit range values FMIN, F1, Fj, FMAX;

a set of comparators 46, e.g., comprising four comparators 461, 462, 46*j*, 46K, where the comparators 461, 462, 46*j*, 46*k* in the set of comparators 46 are each coupled to the frequency counter circuit 44 to receive the measured clock frequency M therefrom and to respective registers 451, 452, 45*j*, 45*k* in the set of registers 45 (e.g., the j-th register 45*j* coupled to the respective j-th comparator 46*j*) to receive the limit range values therefrom, where each comparator (e.g., j-th comparator 46*j*) in the set of comparators 46 is configured to produce a respective indicator signal (e.g., a 1-bit flag signal $I_1$, $I_2$, $I_j$, $I_K$) having a first logic value (e.g., "true" or "1") in case the measured frequency clock M exceeds the limit value of the corresponding (e.g., j-th) frequency subrange (e.g., a j-th subrange comprised in a range above or below Fj) and having a second logic value (e.g., "false" or "0") otherwise;

a plurality of logic ports $LP_0$, $LP_1$, $LP_j$, $LP_K$, such as AND (or NAND) ports having one input preceded by a NOT gate, coupled to comparators 461, 462, 46*j*, 46*k* in the set of comparators 46, the plurality of logic ports $LP_0$, $LP_1$, $LP_j$, $LP_K$ configured to combine indicator signals $I_1$, $I_2$, $I_j$, $I_K$ output by the set of comparators 46 in order to generate a plurality of flag signals F1_F, Fj_F, FK_F having a first logic value (e.g., "1" or "true") in case the clock frequency M is in the corresponding frequency subrange (e.g., in a j-th range comprised within FMIN and F_RANGE_1) and a second logic value (e.g., "0" or "false") otherwise;

the plurality of flag registers 47 are coupled to the set of comparators 46 via the logic ports $LP_0$, $LP_1$, LP2, $LP_j$, each register in the plurality of flag registers 47 configured to store the logic value of the respective (e.g. j-th) flag signal (e.g., Fj_F) provided by a respective (e.g., j-th) logic port (e.g., LPj) based on the indicator signals $I_1$, $I_2$, $I_j$, $I_K$ produced by respective comparators (e.g., 46*j*, 46K) in the set of comparators 46; the plurality of flag registers 47 are also coupled to the second clock divider 43 to receive the second frequency divided clock CLK_P which determines a reset of the flag register values after a number of P periods of the reference clock;

at least one logic combiner port 48, such as a logic NAND (or AND) gate, coupled to the plurality of flag registers 47 to produce a logic combination of the logic values of flag signals stored therein, and the global register 49 coupled to the second frequency divider circuit 43 and to the logic combiner port 48, the global register 49 configured to produce a global flag signal SPREAD_FAULT in response to any one of the sampled values of the flag registers in the plurality of flag registers 47 having a second logic value stored therein.

Figure 6:
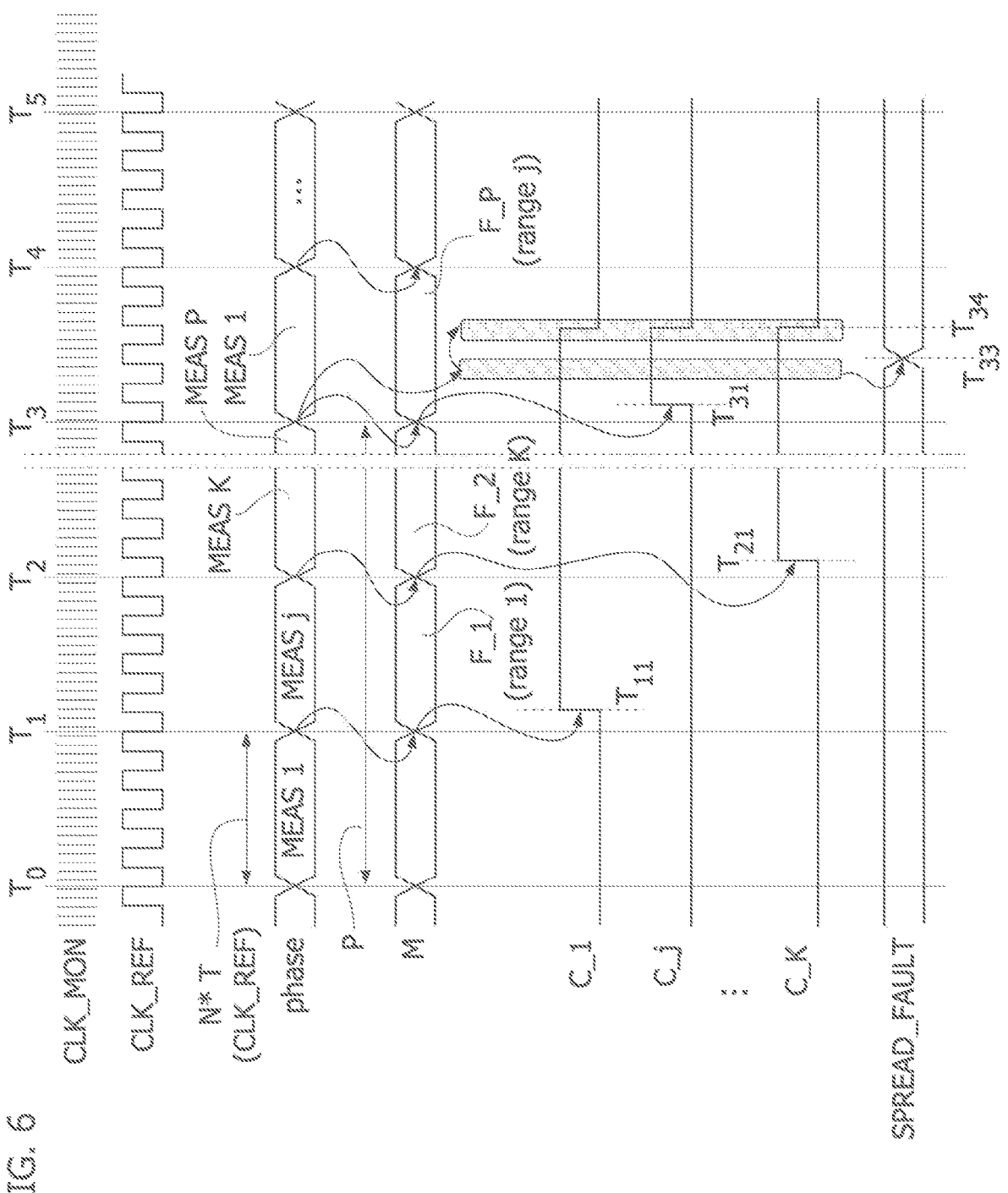
FIG. 6 is an exemplary diagram of an evolution of signals over time in one or more embodiments.

FIG. 6 is a diagram exemplary of operation of the device 40 exemplified in FIG. 5.

As exemplified in FIG. 6, the device 40 operates in a clocked manner with a first set of operations taking place at the falling edge of the N-th reference clock period T(CLK_REF) and a second set of operations taking place at the (N*P)-th falling edge of the reference clock period T(CLK_REF).

As exemplified in FIG. 6, operation of the device 40 comprises:

at a first time instant $T_1$, performing a first measurement, obtaining a first value (e.g., F_1) for the measured clock frequency M, at the first time instant $T_1$, comparing with the various limit values stored in the set of registers 45 the obtained measured frequency value F_1 using the set of comparators 46, at time $T_{11}$ (considering a bit of delay due to signal processing), in response to the first measured frequency F_1 exceeding the minimum frequency F_MIN without reaching the limit frequency F1 of a first frequency subrange, producing (via the comparators in the set of comparators 46) a first comparison signal C_1 (stored in the first register 471 of the set of registers 47) having a first logic value, as well as producing a second comparison signal C_j (stored in the second register 47*j* of the set of registers 47) and a third comparison signal C_K (stored in the third register 47*k* of the set of registers 47) with the second logic value;

at a second time instant $T_2$, performing a second measurement, obtaining a second value (e.g., F_2) for the measured clock frequency M, at the second time instant $T_2$, comparing with the various limit values stored in the set of registers 45 the obtained measured frequency value F_2 using the set of comparators 46, at time $T_{21}$ (taking into account a bit of delay due to signal processing), in response to the second measured frequency F_2 exceeding the frequency Fj without reaching the limit frequency F_MAX of a third frequency subrange, producing (via the comparators in the set of comparators 46) the third comparison signal C_K having a first logic value, while producing the first comparison signal C_1 also having a first logic value; conversely, the second comparison signal C_j is produced with the second logic value;

at a third time instant $T_3$, performing a third measurement, obtaining a third value (e.g., F_P) for the measured clock frequency M, at the third time instant $T_3$, comparing with the various limit values stored in the set of registers 45 the obtained measured frequency value F_P using the set of comparators 46, at time $T_{31}$ (considering a bit of delay due to signal processing), in response to the last measured frequency F_P exceeding the second frequency F1 without reaching the limit frequency F_j of a second frequency subrange, producing (via the comparators in the set of comparators 46) the second comparison signal C_j having a first logic value, while producing the first C1 and third C_K comparison signals also having the first logic value;

at the last time instant T3 (which corresponds to the instant P at which the last measurement ends), the values of signals produced by the set of comparators 46 are logically combined; as a result, the global logic port 48 produced the global flag signal SPREAD_FAULT with the first value, which gets stored in the global register 49 from which it is output at time instant $T_{33}$ (considering a bit of delay due to signal processing);

in response to the global flag signal SPREAD_FAULT being asserted at time instant $T_{33}$, at a further instant $T_{34}$ the contents of the registers 47 in the set of registers 47 is reset, leading to a reinitialization of the method.

As exemplified in FIG. 6, a new measurement can take place starting from instant T₄, following the reset (e.g., to "0" or "false") of all the values stored in the registers 47.

As exemplified in FIG. 5, it may be optionally possible to integrate the "conventional" flagging system exemplified in FIG. 3 into the modified solution. Alternatively, it may be possible to use a dedicated CMU 30 side by side the CMU device 40 to improve precision of the measurement performed by CMU 30, extending it beyond the modulation period.

Figure 7:
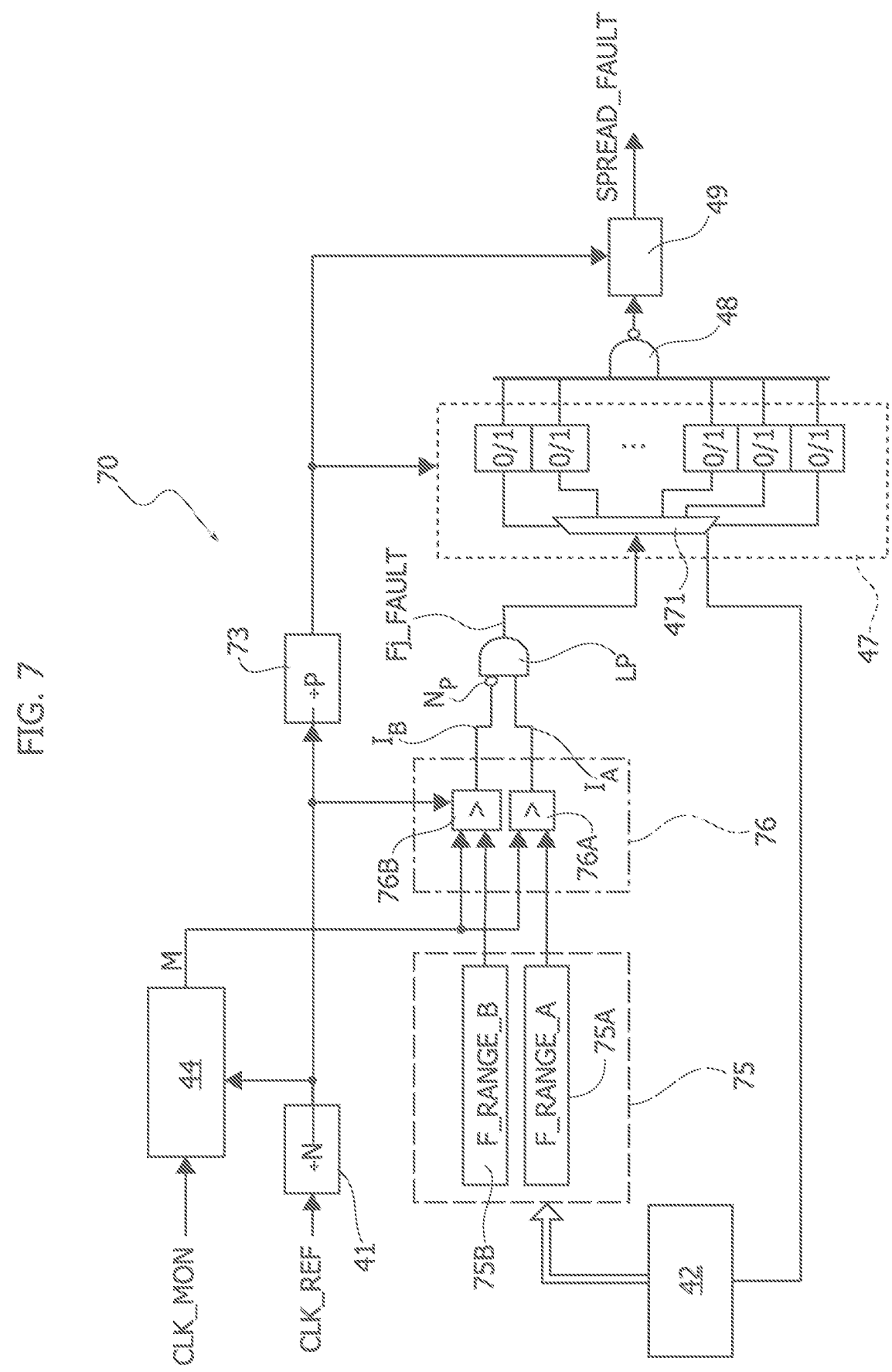

In an alternative exemplary scenario as exemplified in FIG. 7, a CMU device 70 comprises:

a pair of registers 75 comprising a first register 75A and a second register 75B coupled to the control logic unit 42, where the first and second registers 75A, 75B are configured to sequentially store the limit values of adjacent frequency sub-ranges, e.g. via the control unit 42 writing thereto; for instance, during a first measurement phase T1-T2 the control logic unit 42 may write a first value F_RANGE_A (e.g., F_RANGE_A=FMIN) to the first register 75A and a second value F_RANGE_B (e.g., F_RANGE_B=F_RANGE_J) to the second register 75B, while in the next measurement phase T2-T3 the control unit 42 may write the second value F_RANGE_B (e.g., F_RANGE_B=F_RANGE_J) in the first register 75A and a third value F_RANGE_K in the second register 75B;

a pair of comparators 76 comprising a first comparator 76A coupled to the frequency counter circuit 44 and to the first register 75A, and a second comparator 76B coupled to the frequency counter 44 and to the second register 75B; as a result of sequentially varying the quantities stored in the registers 75A, 75B, the comparators 76A, 76B sequentially verify whether the measured clock frequency M belongs to the j-th sub-range as each of the first 76A and second 76B comparators produce a respective indicator signal (e.g., a 1-bit flag signal I_A, I_B) having a first logic value (e.g., "true" or "1") in case the measured frequency clock M exceeds the limit value of the corresponding (e.g., j-th) frequency subrange and having a second logic value (e.g., "false" or "0") otherwise;

the first clock divider 41 is coupled to the pair of comparators 76 which are also coupled to a second clock divider 73 (e.g., having integer scaling factor P), the second clock divider 73 providing the second frequency divided clock CLK_P which determines when to sample the output of the logic combiner 48 into the register 49;

a pair of logic ports NP, LP comprising a logic NOT gate NP coupled to the output of the second comparator 76B and a logic AND gate LP having one input preceded by the NOT gate NP and coupled to the first and second comparators 76A, 76B, configured to combine indicator signals I_A, I_B output by the first 76A and second 76B comparators in order to generate a flag signals Fj_F having a first logic value (e.g., "1" or "true") in case the clock frequency M is in the corresponding j-th frequency subrange and a second logic value (e.g., "0" or "false") otherwise;

the plurality of flag registers 47 are coupled to the logic ports NP, LP (e.g., via a de-multiplexer 471 controlled by the logic unit 42), each j-th register in the plurality of flag registers 47 configured to store the j-th logic value of the flag signal Fj_F provided at the j-th iteration of the sequence of limit values written by the logic unit 42 to the registers 75A, 75B;

a logic combiner port 48, such as a logic NAND gate, coupled to the plurality of flag registers 47 to produce a logic combination of the flag signals stored therein, and the global register 49 coupled to the second frequency divider circuit 43 and to the logic combiner port 48, the global register 49 configured to produce a global flag signal SPREAD_FAULT in response to any one of the sampled values of the flag registers in the plurality of flag registers 47 having a second logic value stored therein.

The solution exemplified in FIG. 7 may advantageously reduce the circuit complexity of the device 70 with respect to that of the scenario exemplified in FIG. 4, at the expense of a relatively longer time involved to produce the global flag signal SPREAD_FAULT.

As exemplified in FIG. 7, a method of operating the device 70, comprises:

loading a first pair of limit range values (e.g., F_RANGE_A and F_RANGE_B) in the registers 75A, 75B, comparing subsequent measures M of the frequency of the input clock signal CLK_MON until a sample of the input clock signal having a frequency in the first pair of limit range values is found, load a subsequent pair of limit range values (e.g., F_RANGE_B, FMAX) in the registers 75A, 75B, iterate the procedure until exploring all the subranges in the frequency range limits FMIN-FMAX, interrupt and restart the procedure at lapse of a P-th period of the reference clock signal CLK_REF.

Figure 8:
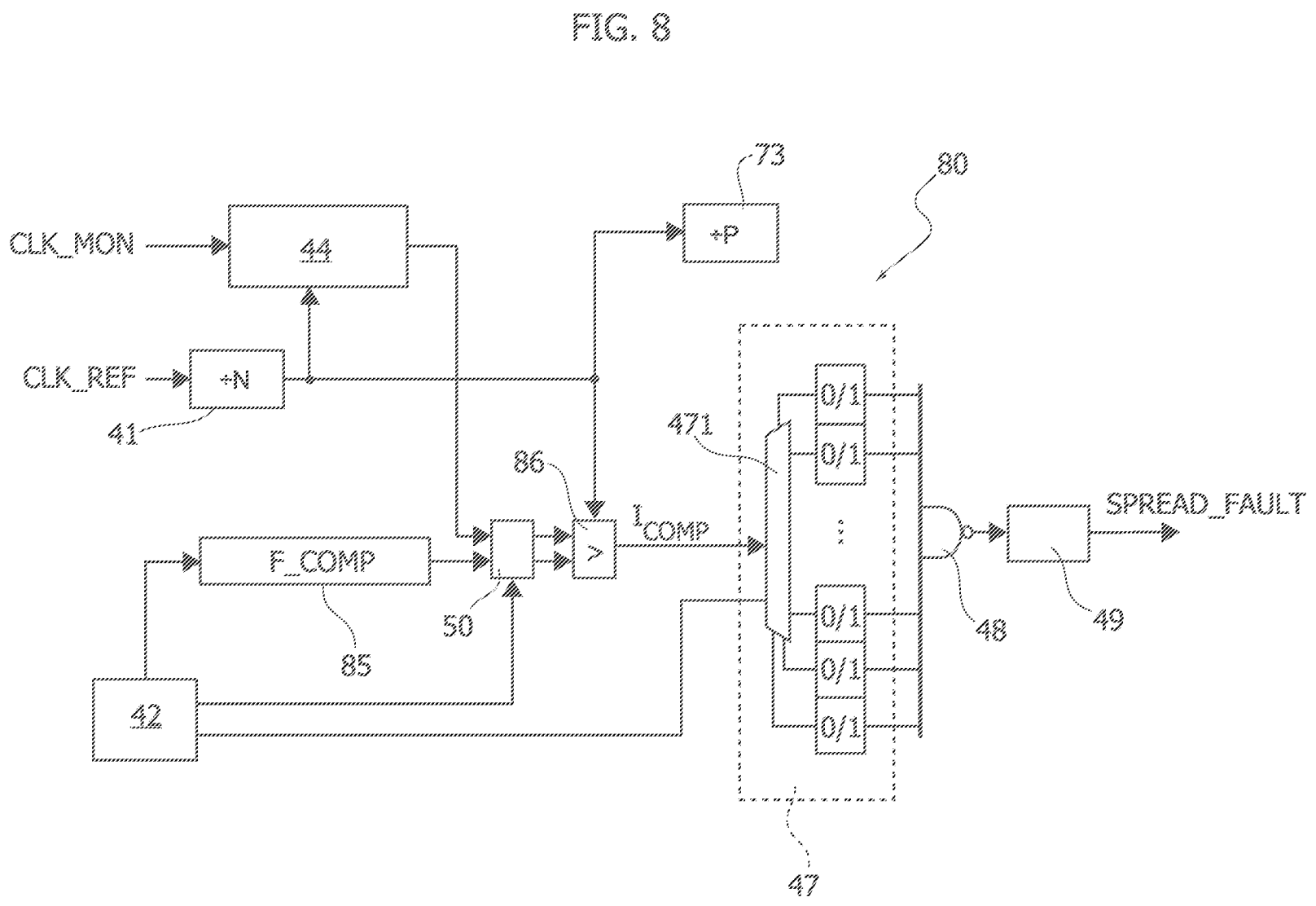

In a further alternative scenario exemplified in FIG. 8, a device 80 comprises:

a register 85 coupled to the control logic unit 42, the register 85 configured to store a frequency value F_COMP whose value is dynamically set or updated by the control logic unit 42, that modifies it to go sequentially from a minimum value FMIN to a maximum value FMAX, for instance with increments equivalent to a K-th fraction of the total range of frequencies FMIN-FMAX;

a comparator 86 coupled to the frequency counter 44 to receive the measured frequency value M and to the register 85 to receive the j-th frequency range limit value F_COMP, the comparator 86 configured to produce an indicator I_COMP having a first logic value (e.g., "true" or "1") in response to the measured frequency M exceeding the frequency range limit value F_COMP and a second logic value (e.g., "false" or "0") in case of the measured frequency M failing to reach the frequency range limit value F_COMP, optionally, a swap unit 50 coupled to the frequency counter 44, the register 85 and the comparator 86 to select the order in which to provide the input signals thereto.

Figure 9:
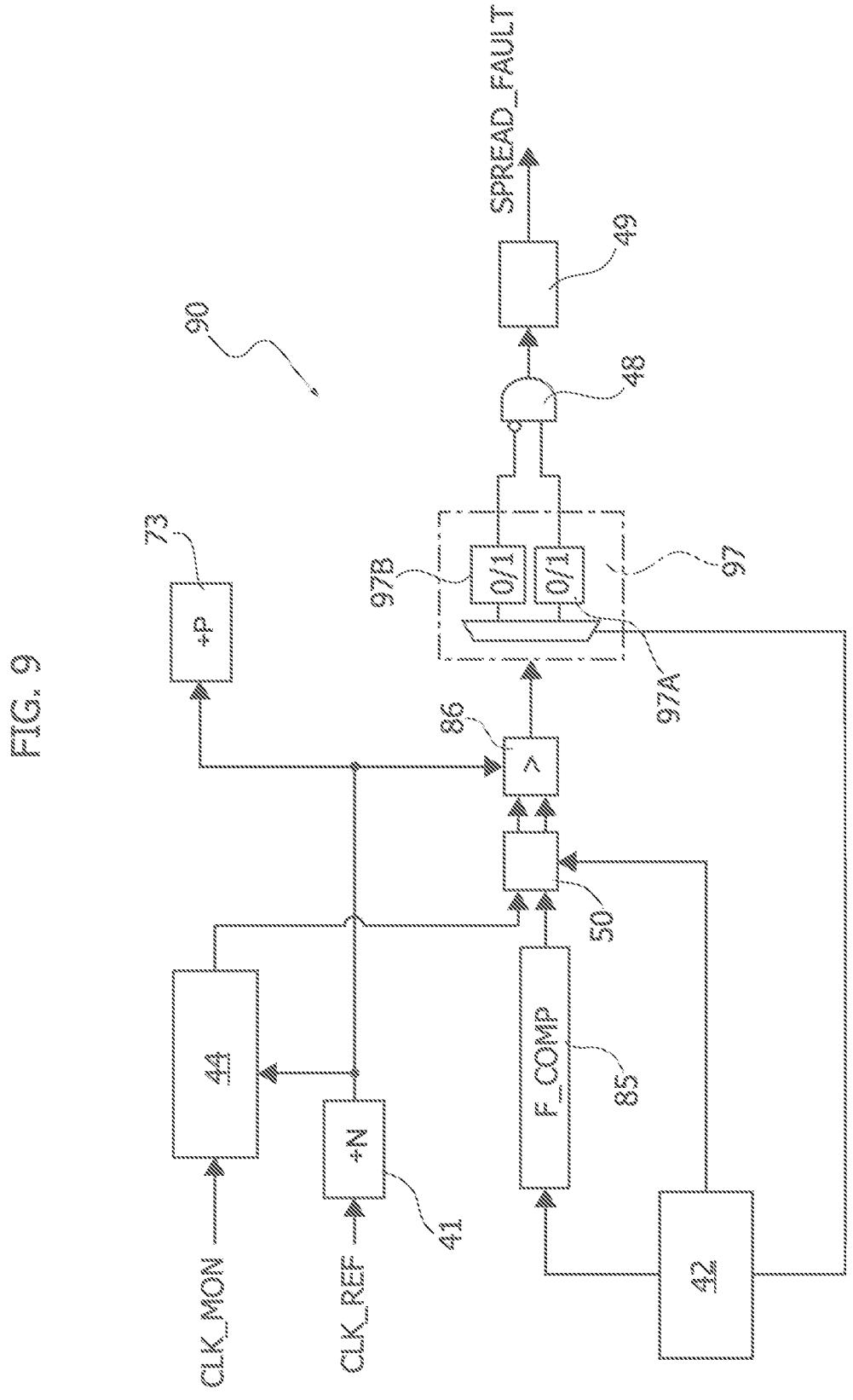

As exemplified in FIGS. 8 and 9, the control unit 42 may be coupled to the swap unit 50 coupled to the comparator 86 in order to perform control thereof, to switch their "polarity" between checking for "input A lower than or equal to input B" (which may be expressed mathematically as A<=B) and checking for "input A greater than or equal to input B" (which may be expressed mathematically as A>=B).

Figure 8A:
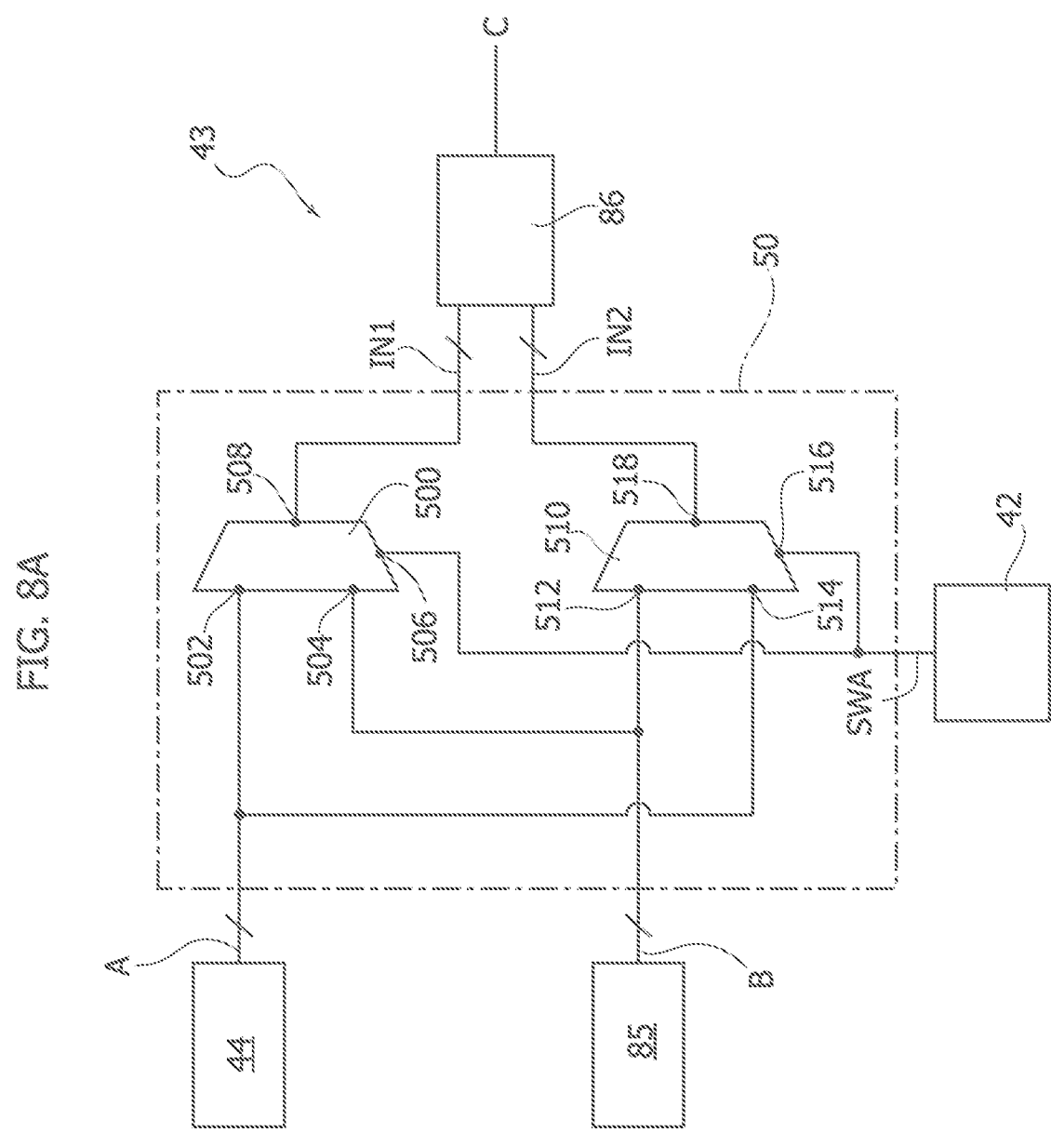

As exemplified in FIG. 8A, the swap unit 50 comprises:

a first multiplexer 500 comprising a first input node 502 coupled to the frequency counter 44, a second input node 504 coupled to the register 85, a first control node 506 coupled to the control unit 42 and a first output node 508 coupled to a first input node of the comparator 86, and a second multiplexer 510 comprising a third input node 512 coupled to the register 85, a fourth input node 514 coupled to the frequency counter 44, a second control node 516 coupled to the control unit 42 and a second output node 518 coupled to a second input node of the comparator 86.

For the sake of simplicity, to illustrate the way in which the swap unit 50 operates the signal from the frequency counter is referenced as signal A, the signals from the register 85 is referenced as signal B, a first output signal provided by the first multiplexer 500 is referenced as signal IN1 and a second output signal provided by the second multiplexer 510 is referenced as signal IN2.

As exemplified in FIG. 8, a way to invert the polarity comprises swapping the order in which the signals to compare are provided at the input nodes of the comparator 86 based on a control signal SWA provided by the control unit 42 at the control nodes 506, 516 of the swap unit 50.

For instance:

in response to the control signal SWA having a first logic value (e.g., "1" or "true"), the first output signal IN1 is equal to a second signal B received at the second input node 504 of the first multiplexer 500 and the second output signal IN2 is equal to a first signal A received at the second input node 514 of the second multiplexer 510, and in response to the control signal SWA having a second logic value (e.g., "0" or "false"), the second output signal IN2 is equal to the first signal A received at the first input node 502 of the first multiplexer 500 and the first output signal IN2 is equal to the second signal B received at the first input node 512 of the second multiplexer 510.

As exemplified in FIG. 8, the value of the indicator $I_{COMP}$ produced by the comparator 86 at each N-th multiple of the clock period of the reference clock CLK_REF is stored in a different flag register of the plurality of flag registers 47, whose contents are evaluated via the logic NAND gate 48, storing the SPREAD_FAULT flag signal in the global register 49 as a result.

The alternative scenario exemplified in FIG. 8 advantageously reduced the complexity of the device 80 with respect to alternative devices 40, 70, at the cost of an increased measurement time.

As exemplified in FIG. 8, a method of operating the device 80 comprises:

loading a first limit range value (e.g., F_COMP=F1) in the register 85, compare the measured frequency M with the limit range until the measured frequency is below the first limit range value, unless P measures have been performed;

load a subsequent j-th limit range;

iterate the previous two steps until exploring all limit range values in the set of limit range values, except the lowest and highest limits;

switch the "polarity" of the comparator 86;

compare the measured frequency M with the limit range value until the measured frequency M is above the limit range value, unless P measures have been performed;

load, in reverse order, a subsequent j-th limit range value, iterate the previous two steps until exploring all limit range values in the set of limit range values, except the lowest and highest limits;

interrupt the method at lapse of the P-th clock period of the reference clock CLK_REF.

In a further alternative scenario as exemplified in FIG. 9, a device 90 comprises a pair of flag registers 97, comprising a first flag register 97A and a second flag register 97B.

As exemplified in FIG. 9, a method of operating the device 90 comprises:

loading the lowest first upper limit value (e.g., F1) of a sequence of ordered limit range values, compare the frequency measured M with the loaded limit value until the comparator yields a value lower than or equal to the loaded limit value, unless P measures have been performed;

load a higher limit range (e.g., Fj) of a sequence of ordered limit range values, switch the "polarity" of the comparator 86 and compare the frequency measured M with the loaded value until the comparator yields a value higher than or equal to the loaded limit value, unless P measures have been performed.

For instance, as soon as at least one of two sequentially output indicator signal values stored in the pair of flag registers 97A, 97B are equal to the second logic value (e.g., "0" or "false"), the global flag signal SPREAD_FAULT is asserted with the first logic value (e.g., "1" or "true"), signaling the presence of a spread spectrum clock fault.

In the scenario exemplified in FIG. 9, the device 90 has reduced complexity with respect to other device scenarios 40, 70, 80 while countering an increase of the measurement time, at the cost of risking to fail to detect a frequency modulation skipping one or more sub-ranges.

As method as exemplified herein, comprises:

receiving an input clock signal CLK_MON having a clock period $T_{CLOCK\_MON}$ and a clock frequency band between a lower frequency limit value FMIN and an upper frequency limit value FMAX;

receiving a reference clock signal CLK_REF having a reference clock period;

dividing 42 the clock frequency band in a set of frequency ranges, wherein frequency ranges in the set of frequency ranges have a set of frequency limit values FMIN, F_RANGE_K−1, FMAX that include the lower frequency limit value and the upper frequency limit value;

measuring 44 a frequency M of the input clock signal;

performing a set of comparisons 46; 76; 86 of the measured frequency with the set of frequency limit values, producing as a result a set of comparison indicators $I_1$, $I_2$, $I_J$, $I_K$; $I_A$, $I_B$; $I_{COMP}$ comprising comparison indicators having a first logic value in response to the measured frequency M failing to exceed the at least one frequency limit value of the set of frequency limit values and having a second logic value in response to the measured frequency exceeding the at least one frequency limit value of the set of frequency limit values;

producing 48, 49 a global flag signal SPREAD_FAULT as a result of at least one of the logic values of comparison indicators in the set of comparison indicators having a second logic value; and providing the global flag signal SPREAD_FAULT to user circuitry, the global flag signal indicating that the measured frequency falls outside of a frequency range.

As exemplified herein, the method comprises:

at lapse of multiples of a product of a first integer N times the reference clock period of the reference clock signal CLK_REF, storing in a set of flag registers 47; 97 the logic values of comparison indicators in the set of comparison indicators, and at lapse of multiples of a product of a second integer P times the reference clock period of the reference clock signal, logically combining 48 the logic values stored in the set of flag registers.

As exemplified herein, performing the set of comparisons of the measured frequency comprises performing the set of comparisons of the measured frequency (M) with each frequency in the set of frequency limit values, wherein the method further comprises:

pairwise, logically combining $LP_0$, $LP_1$, $LP_j$ comparison indicators in the set of comparison indicators using a logic gate LP, and storing 47 the logic value of each of the pairwise logic combinations of comparison indicators in the set of comparison indicators in a respective flag register 471, 47j, 47K of a set of flag registers 47, and producing 48 the global flag signal as a result of at least one of the logic values of stored in the flag registers having a second logic value.

As exemplified herein, performing the set of comparisons of the measured frequency with the set of frequency limit values comprises:

ordering the set of frequency limit values in an increasing or decreasing order of limit values;

performing a pair of comparisons 76A, 76B of the measured frequency with a respective pair of sequentially adjacent frequency limit values in the ordered set of frequency limit values, producing a pair of comparison indicators $I_A$, $I_B$ as a result.

For instance, the method further comprises:

logically combining the pair of comparison indicators using a logic (e.g., NAND) gate LP;

storing 47 the logic value of the logic combination of each of the sequentially performed pairs of comparisons 76A, 76B in a respective flag register of a set of flag registers 47; and producing 48, 49 a global flag signal SPREAD_FAULT as a result of at least one of the logic values of stored in the set of flag registers (47) having a second logic value.

As exemplified herein, the method comprises:

ordering the set of frequency limit values in increasing or decreasing order of values;

alternating selecting the upper frequency range limit and the lower frequency range limit and alternating performing the comparison of the measured frequency (M) with the upper limit value and the lower limit value, respectively.

For instance, the method further comprises:

storing the logic values of the indicators produced as a result of the alternated comparisons in a respective flag register 97A, 97B, logically combining the stored indicator values using a logic gate 48; and producing 49 the global flag signal as a result of at least one of the logic values of stored in the flag registers having a second logic value.

A device 40; 70; 80; 90 as exemplified herein, comprises:

an input clock node CLK_MON configured to receive an input clock signal having a clock period $T_{CLOCK\_MON}$ and a clock frequency band between a lower frequency limit value FMIN and an upper frequency limit value FMAX;

a reference clock node CLK_REF configured to receive a reference clock signal having a reference clock period;

a logic control unit 42 configured to divide the clock frequency band in a set of frequency ranges, wherein frequency ranges in the set of frequency ranges have a set of frequency limit values FMIN, F_RANGE_K−1, FMAX that include the lower frequency limit value and the upper frequency limit value;

a frequency counter circuit 44 coupled to the input clock node CLK_MON to receive the input clock signal therefrom, the frequency counter circuit configured to measure a frequency of the input clock signal;

a set of comparators 46; 76; 86 coupled to the frequency counter circuit to receive the measured frequency of the input clock signal therefrom, the set of comparators 46; 76; 86 configured to perform a set of comparisons of the measured frequency with the set of frequency limit values, producing as a result a set of comparison indicators $I_1$, $I_2$, $I_J$, $I_K$; $I_A$, $I_B$; $I_{COMP}$ comprising comparison indicators having a first logic value in response to the measured frequency failing to exceed the at least one frequency limit value of the set of frequency limit values and having a second logic value in response to the measured frequency exceeding the at least one frequency limit value of the set of frequency limit values;

logic circuitry 48, 49 coupled to the set of comparators 46; 76; 86 to receive the set of comparison indicators $I_1$, $I_2$, $I_J$, $I_K$; $I_A$, $I_B$; $I_{COMP}$ therefrom, the logic circuitry 48, 49 configured to produce a global flag signal SPREAD_FAULT as a result of at least one of the logic values of comparison indicators in the set of comparison indicators $I_1$, $I_2$, $I_J$, $I_K$; $I_A$, $I_B$; $I_{COMP}$ having a second logic value, the logic circuitry further configured to provide the global flag signal to user circuitry, the global flag signal indicating that the measured frequency falls outside of a frequency range.

As exemplified herein, the device comprises:

a set of flag registers 47; 97 coupled to the set of comparators configured to store, at lapse of multiples of a product of a first integer N times the reference clock period of the reference clock signal, the logic values of the comparison indicators in the set of indicators, and at least one gate LP, 48 configured to logically combine, at lapse of multiples of a product of a second integer P times the reference clock period of the reference clock signal, the logic values stored in the set of flag registers.

As exemplified herein, the set of comparators is configured to perform the set of comparisons of the measured frequency with each frequency in the set of frequency limit values, wherein the device further comprises:

a set of logic gates $LP_0$, $LP_1$, $LP_j$ coupled to the set of comparators to receive the set of comparison indicators $I_1$, $I_2$, $I_J$, $I_K$; $I_A$, $I_B$; $I_{COMP}$ therefrom, the set of logic gates configured to logically combine, pairwise, comparison indicators in the set of comparison indicators, and a set of flag registers 47 coupled to the set of logic gates $LP_0$, $LP_1$, $LP_j$, the set of flag registers configured to store the logic value of each of the pairwise logic combinations of comparison indicators in the set of comparison indicators $I_1$, $I_2$, $I_J$, $I_K$; $I_A$, $I_B$; $I_{COMP}$ in respective flag registers 471, 47j, 47K of the set of flag registers 47, and wherein the logic circuitry 48, 49 is configured to produce the global flag signal as a result of at least one of the logic values of stored in the set of flag registers having a second logic value.

As exemplified herein, the logic unit 42 is configured to order the set of frequency limit values in an increasing or decreasing order of limit values; and the set of comparators comprises a pair of comparators 76A, 76B configured to perform comparisons of the measured frequency with a respective pair of sequentially adjacent frequency limit values in the ordered set of frequency limit values. For instance, the device further comprises: a logic gate LP coupled to the pair of comparators 76A, 76B to receive a pair of comparison indicators $I_A$, $I_B$ therefrom, the logic gate LP configured to logically combine the pair of comparison indicators $I_A$, $I_B$; and a set of flag registers 47 coupled to the logic gate LP, the set of flag registers configured to store the logic value of the logic combination LP of each of the sequentially performed pairs of comparisons 76A, 76B in a respective flag register of the set of flag registers 47. For instance, the logic circuitry is configured to produce the global flag signal as a result of at least one of the logic values of stored in the set of flag registers having a second logic value.

As exemplified herein, the logic control unit 42 is configured to:

order the set of frequency limit values in increasing or decreasing order of values, and alternately select the upper frequency range limit and the lower frequency range limit.

As exemplified herein, the set of comparators 46; 76; 86 comprises a comparator that is configured to alternating performing the comparison of the measured frequency (M) with the upper limit value and the lower limit value, respectively.

For instance, the device further comprises a pair of flag registers 97A, 97B coupled to the set of comparators 46; 76; 86 and configured to store the logic values of the indicators produced as a result of the alternated comparisons in respective flag registers 97A, 97B, wherein the logic circuitry 48, 49 comprises a logic gate 48 coupled to the pair of flag registers 97A, 97B and configured to logically combine the stored indicator values.

As exemplified herein, a system (e.g., a GNSS navigation system) comprises:

an antenna RX configured to receive a satellite positioning signal as an analog signal, processing circuitry 120, 140 coupled to the antenna RX and configured to apply analog-to-digital, ADC processing to the received analog signal, at least one device as per the present disclosure coupled to the processing circuitry to provide thereto the global flag signal.

For instance, the system is equipped on-board a vehicle V (such as an autonomous road vehicle, for instance).

Figure 10:
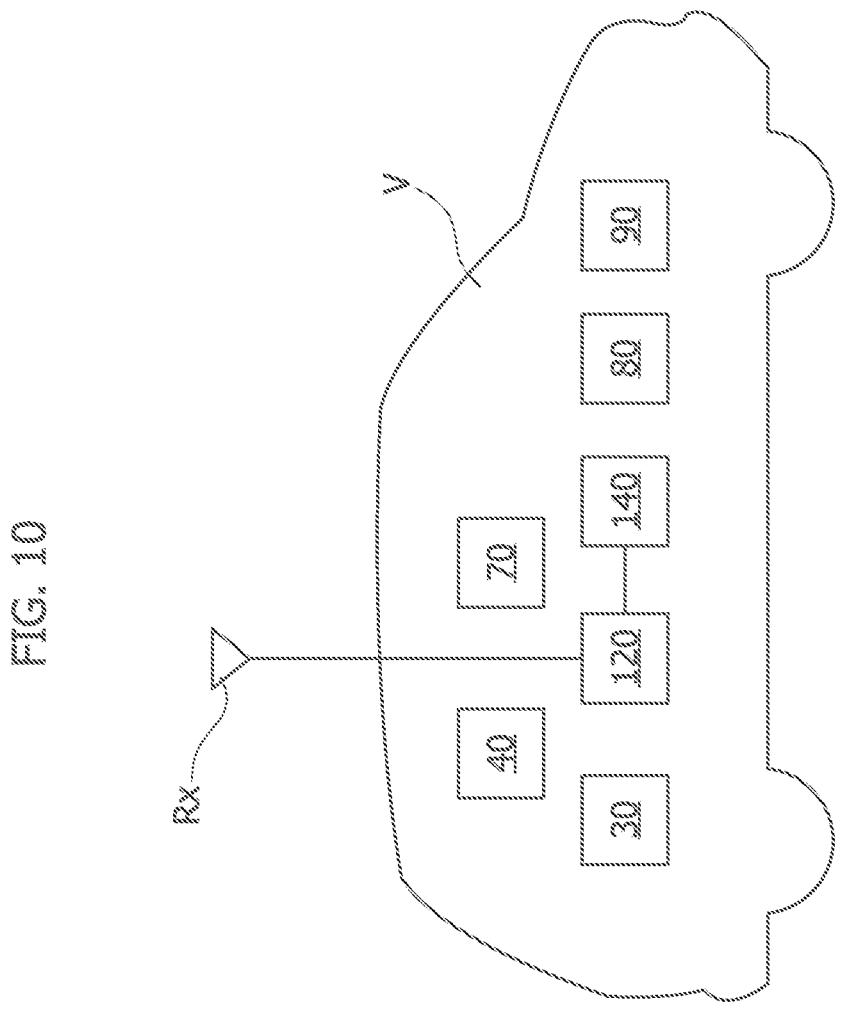
FIG. 10 is exemplary of a system as per the present disclosure.

As exemplified in FIG. 10, one or more embodiments may be equipped on-board a vehicle, preferably embedded in a satellite-based navigation system such as a GNSS receiver.

A navigation receiver operates by down converting to quasi baseband the input signal received from the satellites, which is transmitted at a plurality of radio-frequency bands, using a local oscillator to step down the input frequency and allow a baseband digital management of the satellite information.

With reference to FIG. 10, which diagrammatically shows a GNSS (Global Navigation Satellite System) system (such as, for example, Global Positioning System (GPS), Global'naya Navigatsionnaya Sputnikovaya Sistema (GLO-NASS), Galileo System, or other types of satellite-based positioning systems), such global satellite positioning system comprising a constellation of a number N of satellites $SC_1$-$SC_N$ and at least a receiving apparatus 10.

The receiving apparatus 100 comprises an antenna RX, an analog receiving module analog front end (AFE), provided with a radio frequency (RF) stage 120, and an analog-digital converter (ADC) 140, which can be implemented by hardware modules.

The receiving apparatus 100 may be provided with a central processing unit, memories (mass memory and/or working storage) and respective interfaces (not shown in figures), comprising a microprocessor or microcontroller, for running the software resident in it.

As exemplified in FIG. 10, one or more devices 30, 40, 70, 80, 90 may be configured to provide a clock signal for synchronized processing of signals received by the GNSS receiver. It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

What is claimed is:

1. A method, comprising:

receiving an input clock signal having a clock period and a clock frequency band between a lower frequency limit value and an upper frequency limit value;

receiving a reference clock signal having a reference clock period;

dividing the clock frequency band into a set of frequency ranges having a set of frequency limit values that include the lower frequency limit value and the upper frequency limit value;

measuring a frequency of the input clock signal;

performing a set of comparisons of the measured frequency with the set of frequency limit values, producing, as a result, a set of comparison indicators comprising comparison indicators having a first logic value in response to the measured frequency failing to exceed at least one frequency limit value of the set of frequency limit values and having a second logic value in response to the measured frequency exceeding the at least one frequency limit value of the set of frequency limit values;

producing a global flag signal as a result of at least one of the logic values of comparison indicators in the set of comparison indicators having the second logic value; and providing the global flag signal to user circuitry, the global flag signal indicating that the measured frequency falls outside of at least one of the frequency ranges.

2. The method of claim 1, comprising:

at lapse of multiples of a product of a first integer N times the reference clock period of the reference clock signal, storing in a set of flag registers the logic values of comparison indicators in the set of comparison indicators, and at lapse of multiples of a product of a second integer P times the reference clock period of the reference clock signal, logically combining the logic values stored in the set of flag registers.

3. The method of claim 1, wherein performing the set of comparisons of the measured frequency comprises performing the set of comparisons of the measured frequency with each frequency in the set of frequency limit values, and the method further comprises:

pairwise, logically combining comparison indicators in the set of comparison indicators using a logic gate; and storing the logic value of each of the pairwise logic combinations of comparison indicators in the set of comparison indicators in a respective flag register of a set of flag registers; and producing the global flag signal as a result of at least one of the logic values stored in the flag registers having the second logic value.

4. The method of claim 1, wherein:

performing the set of comparisons of the measured frequency with the set of frequency limit values comprises:

ordering the set of frequency limit values in an increasing or decreasing order of limit values; and performing a pair of comparisons of the measured frequency with a respective pair of sequentially adjacent frequency limit values in the ordered set of frequency limit values, producing as a result a pair of comparison indicators; and the method further comprises:

logically combining the pair of comparison indicators using a logic gate;

storing the logic value of the logic combination of each pair of comparison indicators in a respective flag register of a set of flag registers; and producing the global flag signal as a result of at least one of the logic values stored in the set of flag registers having the second logic value.

5. The method of claim 1, wherein:

performing the set of comparisons of the measured frequency with the set of frequency limit values comprises:

ordering the set of frequency limit values in increasing or decreasing order of values; and alternating selecting the upper frequency limit value and the lower frequency limit value and alternating performing a comparison of the measured frequency with the upper frequency limit value and the lower frequency limit value, respectively; and the method further comprises:

storing the logic values of the comparison indicators produced as a result of the alternated comparisons in a respective flag register, logically combining the stored logic values using a logic gate; and producing the global flag signal as a result of at least one of the logic values stored in the flag registers having the second logic value.

6. A device, comprising:

an input clock node configured to receive an input clock signal having a clock period and a clock frequency band between a lower frequency limit value and an upper frequency limit value;

a reference clock node configured to receive a reference clock signal having a reference clock period;

a logic control unit configured to divide the clock frequency band in a set of frequency ranges having a set of frequency limit values that include the lower frequency limit value and the upper frequency limit value;

a frequency counter circuit coupled to the input clock node to receive the input clock signal therefrom, the frequency counter circuit configured to measure a frequency of the input clock signal;

a set of comparators coupled to the frequency counter circuit to receive the measured frequency of the input clock signal therefrom, the set of comparators configured to perform a set of comparisons of the measured frequency with the set of frequency limit values, producing, as a result, a set of comparison indicators comprising comparison indicators having a first logic value in response to the measured frequency failing to exceed at least one frequency limit value of the set of frequency limit values and having a second logic value in response to the measured frequency exceeding the at least one frequency limit value of the set of frequency limit values; and logic circuitry coupled to the set of comparators to receive the set of comparison indicators therefrom, the logic circuitry configured to produce a global flag signal as a result of at least one of the logic values of comparison indicators in the set of comparison indicators having the second logic value, the logic circuitry further configured to provide the global flag signal to user circuitry, the global flag signal indicating that the measured frequency falls outside of at least one of the frequency ranges.

7. The device of claim 6, further comprising:

a set of flag registers coupled to the set of comparators configured to store, at lapse of multiples of a product of a first integer N times the reference clock period of the reference clock signal, the logic values of the comparison indicators in the set of comparison indicators; and at least one gate configured to logically combine, at lapse of multiples of a product of a second integer P times the reference clock period of the reference clock signal, the logic values stored in the set of flag registers.

8. The device of claim 6, wherein the set of comparators is configured to perform the set of comparisons of the measured frequency with each frequency in the set of frequency limit values, and wherein the device further comprises:

a set of logic gates coupled to the set of comparators to receive the set of comparison indicators therefrom, the set of logic gates configured to logically combine, pairwise, comparison indicators in the set of comparison indicators; and a set of flag registers coupled to the set of logic gates, the set of flag registers configured to store the logic value of each of the pairwise logic combinations of comparison indicators in the set of comparison indicators in respective flag registers of the set of flag registers;

wherein the logic circuitry is configured to produce the global flag signal as a result of at least one of the logic values stored in the set of flag registers having the second logic value.

9. The device of claim 6, wherein:

the logic control unit is configured to order the set of frequency limit values in an increasing or decreasing order of limit values;

the set of comparators comprises a pair of comparators configured to perform comparisons of the measured frequency with a respective pair of sequentially adjacent frequency limit values in the ordered set of frequency limit values; and the device further comprises:

a logic gate coupled to the pair of comparators to receive a pair of comparison indicators therefrom, the logic gate configured to logically combine the pair of comparison indicators;

a set of flag registers coupled to the logic gate, the set of flag registers configured to store the logic value of the logic combination of each pair of comparison indicators in a respective flag register of the set of flag registers; and wherein the logic circuitry is configured to produce the global flag signal as a result of at least one of the logic values stored in the set of flag registers having the second logic value.

10. The device of claim 6, wherein:

the logic control unit is configured to order the set of frequency limit values in increasing or decreasing order of values, and alternately select the upper frequency limit value and the lower frequency limit value;

the set of comparators comprises a comparator that is configured to alternating performing a comparison of the measured frequency with the upper frequency limit value and the lower frequency limit value, respectively; and the device further comprises a pair of flag registers coupled to the set of comparators and configured to store the logic values of the comparison indicators produced as a result of the alternated comparisons in respective flag registers;

wherein the logic circuitry comprises a logic gate coupled to the pair of flag registers and configured to logically combine the stored logic values.

11. A system, comprising:

an antenna configured to receive a satellite positioning signal as an analog signal, processing circuitry coupled to the antenna and configured to apply analog-to-digital (ADC) processing to the received satellite positioning signal; and at least one device coupled to the processing circuitry to provide thereto a global flag signal, wherein each device comprises:

an input clock node configured to receive an input clock signal having a clock period and a clock frequency band between a lower frequency limit value and an upper frequency limit value;

a reference clock node configured to receive a reference clock signal having a reference clock period;

a logic control unit configured to divide the clock frequency band into a set of frequency ranges having a set of frequency limit values that include the lower frequency limit value and the upper frequency limit value;

a frequency counter circuit coupled to the input clock node to receive the input clock signal therefrom, the frequency counter circuit configured to measure a frequency of the input clock signal;

a set of comparators coupled to the frequency counter circuit to receive the measured frequency of the input clock signal therefrom, the set of comparators configured to perform a set of comparisons of the measured frequency with the set of frequency limit values, producing as a result a set of comparison indicators comprising comparison indicators having a first logic value in response to the measured frequency failing to exceed at least one frequency limit value of the set of frequency limit values and having a second logic value in response to the measured frequency exceeding the at least one frequency limit value of the set of frequency limit values; and logic circuitry coupled to the set of comparators to receive the set of comparison indicators therefrom, the logic circuitry configured to produce the global flag signal as a result of at least one of the logic values of comparison indicators in the set of comparison indicators having the second logic value, the logic circuitry further configured to provide the global flag signal to user circuitry, the global flag signal indicating that the measured frequency falls outside of at least one of the frequency ranges.

12. The system of claim 11, wherein the system is equipped on-board a vehicle.

13. The system of claim 12, wherein the vehicle is a road vehicle.

14. The system of claim 13, wherein the vehicle is an autonomous road vehicle.

15. The system of claim 11, wherein the system is a Global Navigation Satellite System (GNSS) navigation system.

16. The system of claim 11, wherein the system comprises more than one device.

17. The system of claim 11, wherein each device further comprises:

a set of flag registers coupled to the set of comparators configured to store, at lapse of multiples of a product of a first integer N times the reference clock period of the reference clock signal, the logic values of the comparison indicators in the set of comparison indicators; and at least one gate configured to logically combine, at lapse of multiples of a product of a second integer P times the reference clock period of the reference clock signal, the logic values stored in the set of flag registers.

18. The system of claim 11, wherein the set of comparators is configured to perform the set of comparisons of the measured frequency with each frequency in the set of frequency limit values, and wherein each device further comprises:

a set of logic gates coupled to the set of comparators to receive the set of comparison indicators therefrom, the set of logic gates configured to logically combine, pairwise, comparison indicators in the set of comparison indicators; and a set of flag registers coupled to the set of logic gates, the set of flag registers configured to store the logic value of each of the pairwise logic combinations of comparison indicators in the set of comparison indicators in respective flag registers of the set of flag registers;

wherein the logic circuitry is configured to produce the global flag signal as a result of at least one of the logic values stored in the set of flag registers having the second logic value.

19. The system of claim 11, wherein:

the logic control unit is configured to order the set of frequency limit values in an increasing or decreasing order of limit values;

the set of comparators comprises a pair of comparators configured to perform comparisons of the measured frequency with a respective pair of sequentially adjacent frequency limit values in the ordered set of frequency limit values; and each device further comprises:

a logic gate coupled to the pair of comparators to receive a pair of comparison indicators therefrom, the logic gate configured to logically combine the pair of comparison indicators;

a set of flag registers coupled to the logic gate, the set of flag registers configured to store the logic value of the logic combination of each pair of comparison indicators in a respective flag register of the set of flag registers; and wherein the logic circuitry is configured to produce the global flag signal as a result of at least one of the logic values stored in the set of flag registers having the second logic value.

20. The system of claim 11, wherein:

the logic control unit is configured to order the set of frequency limit values in increasing or decreasing order of values, and alternately select the upper frequency limit value and the lower frequency limit value;

the set of comparators comprises a comparator that is configured to alternating performing a comparison of the measured frequency with the upper frequency limit value and the lower frequency limit value, respectively; and each device further comprises a pair of flag registers coupled to the set of comparators and configured to store the logic values of the comparison indicators produced as a result of the alternated comparisons in respective flag registers;

wherein the logic circuitry comprises a logic gate coupled to the pair of flag registers and configured to logically combine the stored logic values.

\*   \*   \*   \*   \*